(12) United States Patent
Kim (10) Patent No.: US 11,187,755 B2
(45) Date of Patent: Nov. 30, 2021

(54) APPARATUS AND METHOD FOR ESTIMATING SOC OF BATTERY (71) Applicant: LG CHEM, LTD., Seoul (KR)

(72) Inventor: Ji-Il Kim, Daejeon (KR)

(73) Assignee: LG Chem, Ltd., Seoul (KR)

(*) Notice: Subject to any disclaimer, the term of this patent is extended or adjusted under 35 U.S.C. 154(b) by 157 days.

(21) Appl. No.: 16/603,402

(22) PCT Filed: Nov. 1, 2018

(86) PCT No.: PCT/KR2018/013215
§ 371 (c)(1),
(2) Date: Oct. 7, 2019

(87) PCT Pub. No.: WO2019/088746
PCT Pub. Date: May 9, 2019

(65) Prior Publication Data
US 2020/0033420 A1 Jan. 30, 2020

(30) Foreign Application Priority Data
Nov. 1, 2017 (KR) .................. 10-2017-0144925

(51) Int. Cl.
G01R 31/3842 (2019.01)
G01R 31/367 (2019.01)
H01M 10/48 (2006.01)

(52) U.S. Cl.
CPC ....... *G01R 31/3842* (2019.01); *G01R 31/367* (2019.01); *H01M 10/48* (2013.01)

(58) Field of Classification Search
CPC G01R 31/3842; G01R 31/367; G01R 31/387; G01R 31/382; H01M 10/48; Y02E 60/10
See application file for complete search history.

(56) References Cited

U.S. PATENT DOCUMENTS 8,046,181 B2 * 10/2011 Kang .................. G01R 31/3648
702/63
8,653,794 B2 * 2/2014 Joe ........................ G01R 31/378
320/134

(Continued)

FOREIGN PATENT DOCUMENTS

CN 1883097 A 12/2006
CN 104617623 A 5/2015

(Continued)

OTHER PUBLICATIONS

Extended European Search Report dated May 27, 2020, issued in corresponding European Patent Application No. 18873100.4.

(Continued)

*Primary Examiner* — Mohammad K Islam
(74) *Attorney, Agent, or Firm* — Morgan, Lewis & Bockius LLP (57) ABSTRACT Disclosed is an apparatus and method for estimating a state of charge (SOC) of a battery. The battery SOC estimating apparatus includes a measurement unit configured to measure state information of a battery; a first core unit configured to estimate a first SOC of the battery by applying a first battery modeling technique, based on the state information of the battery measured by the measurement unit; and a second core unit configured to estimate a second SOC of the battery by applying a second battery modeling technique different from the first battery modeling technique, based on the state information of the battery measured by the measurement unit, wherein the second core unit transmits the estimated second SOC to the first core unit, and wherein the first core unit estimates the first SOC of the battery by reflecting the second SOC transmitted by the second core unit.

9 Claims, 3 Drawing Sheets

(56) References Cited

U.S. PATENT DOCUMENTS

| | | | |
|---|---|---|---|
| 8,965,723 B2* | 2/2015 | Jo | G01R 31/3828 |
| | | | 702/63 |
| 9,000,732 B2* | 4/2015 | Kim | G01R 31/392 |
| | | | 320/162 |
| 9,020,798 B2* | 4/2015 | Haupt | G01R 31/367 |
| | | | 703/18 |
| 9,046,583 B2* | 6/2015 | Joe | G01R 31/367 |
| 10,147,983 B2 | 12/2018 | Kawahara et al. | |
| 10,209,320 B2* | 2/2019 | Cha | H01M 10/48 |
| 10,502,791 B1* | 12/2019 | Li | G01R 31/367 |
| 10,718,814 B2* | 7/2020 | Seo | G01R 31/3842 |
| 10,809,303 B2* | 10/2020 | Lee | G01R 31/392 |
| 10,884,065 B2* | 1/2021 | Lim | G01R 31/396 |
| 11,005,271 B2* | 5/2021 | Kim | H01M 10/425 |
| 2005/0110498 A1 | 5/2005 | Plett | |
| 2010/0174499 A1 | 7/2010 | Kang et al. | |
| 2011/0054816 A1 | 3/2011 | Prada et al. | |
| 2013/0027047 A1 | 1/2013 | Yoshioka et al. | |
| 2014/0149058 A1* | 5/2014 | Moh | G01R 31/3835 |
| | | | 702/63 |
| 2014/0210418 A1* | 7/2014 | Wang | H02J 7/00 |
| | | | 320/134 |
| 2014/0303915 A1 | 10/2014 | Jo et al. | |
| 2015/0046108 A1 | 2/2015 | Akamine | |
| 2015/0081237 A1 | 3/2015 | Ye et al. | |
| 2015/0112619 A1* | 4/2015 | Takahashi | G01R 31/3648 |
| | | | 702/63 |
| 2015/0326038 A1 | 11/2015 | Lee | |
| 2016/0018469 A1 | 1/2016 | Ho | |
| 2016/0110242 A1 | 4/2016 | Kwon et al. | |
| 2017/0045587 A1 | 2/2017 | Kim et al. | |
| 2017/0125853 A1 | 5/2017 | Song et al. | |
| 2017/0199247 A1 | 7/2017 | Joe | |
| 2017/0288414 A1 | 10/2017 | Klein et al. | |
| 2018/0017628 A1* | 1/2018 | Takegami | H01M 10/44 |

FOREIGN PATENT DOCUMENTS

| | | |
|---|---|---|
| CN | 104852414 A | 8/2015 |
| CN | 104914380 A | 9/2015 |
| CN | 106443459 A | 2/2017 |
| CN | 106646265 A | 5/2017 |
| CN | 106932728 A | 7/2017 |
| CN | 107091992 A | 8/2017 |
| JP | 2014-231988 A | 12/2014 |
| JP | 2016-515195 A | 5/2016 |
| JP | 2017-194282 A | 10/2017 |
| JP | 6300567 B2 | 3/2018 |
| KR | 10-2009-0020470 A | 2/2009 |
| KR | 10-2014-0053592 A | 5/2014 |
| KR | 10-2015-0087707 A | 7/2015 |
| KR | 10-2015-0089224 A | 8/2015 |
| KR | 10-2016-0048666 A | 5/2016 |
| KR | 10-2016-0103332 A | 9/2016 |
| KR | 10-2017-0020072 A | 2/2017 |
| KR | 10-2017-0051008 A | 5/2017 |
| KR | 10-1777334 B1 | 9/2017 |

OTHER PUBLICATIONS

Offfice Action dated Sep. 29, 2020, issued in corresponding Japanese Patent Application No. 2019-549477.

International Search Report dated Feb. 12, 2019, issued in corresponding International Patent Application No. PCT/KR2018/013215.

Office Action dated Feb. 3, 2021, issued in corresponding Chinese Patent Application No. 201880021963.6.

Office Action dated Apr. 27, 2021, issued in corresponding Japanese Patent Application No. 2019-549477.

* cited by examiner

APPARATUS AND METHOD FOR ESTIMATING SOC OF BATTERY

TECHNICAL FIELD

The present application claims priority to Korean Patent Application No. 10-2017-0144925 filed on Nov. 1, 2017 in the Republic of Korea, the disclosures of which are incorporated herein by reference.

The present disclosure relates to a technique for estimating a state of a battery, and more particularly, to an apparatus and method for estimating a state of charge (SOC) as a state of a battery.

BACKGROUND ART

In recent years, the demand for portable electronic products such as notebook computers, video cameras and portable phones has increased sharply, and energy storage batteries, robots and satellites has been active developed. Accordingly, high-performance secondary batteries allowing repeated charging and discharging are being actively studied.

Secondary batteries commercially available at the present include nickel-cadmium batteries, nickel-hydrogen batteries, nickel-zinc batteries, lithium secondary batteries and the like. Among them, the lithium secondary batteries have almost no memory effect compared to nickel-based secondary batteries and thus are in the limelight due to various advantageous such as free charging and discharging, low self-discharge rate and high energy density.

In particular, as carbon energy is gradually depleted and the interest in environment is increasing, the demand for hybrid electric vehicles and electric vehicles is recently increasing all over the world. The hybrid electric vehicle or electric vehicle uses the charge/discharge energy of a battery pack to obtain a vehicle driving power. Thus, compared with vehicles using only an engine, the fuel economy is excellent and the pollutant is not discharged or reduced, which receives positive response from many consumers. For this reason, more attention and research are focused on a battery for vehicles, which is a core component of hybrid electric vehicles and electric vehicles.

One of the most important issues about the battery is to accurately figure out a current state of the battery. The state of the battery may include various factors, among which SOC information may be regarded as very important information as state information of the battery.

Generally, the battery is used for various mobile devices such as a vehicle and a cellular phone, and it is very important to predict a usable time. The SOC is a measure for figuring out how long the battery is usable, which may be regarded as very important information for a user to use the device. For this reason, a general battery-mounted device such as a laptop, a cellular phone and a vehicle estimates the SOC of the battery, obtain information such as the available time and usable capacity of the battery, and provide the information to the user.

The SOC of the battery is generally expressed as a residual capacity of the battery, compared to a full charge capacity (FCC), as a percentage. So far, various techniques have been used or suggested as a method for estimating a SOC of a battery. A representative SOC estimation method is to estimate the SOC using a current integration method. In the current integration method, the SOC is obtained by integrating input/output current of the battery and adding/subtracting the input/output current to/from an initial capacity.

However, in the current integration method, since the SOC is estimated by a current measured through a current sensor installed at a charging and discharging path of the battery, accurate sensing of the current sensor is very important. However, a current value sensed by the current sensor may be different from an actual current due to factors such as malfunction or degradation. Thus, in the conventional current integration method, the accuracy of the estimated SOC value may be degraded depending on the situation of the current sensor.

Recently, a technique for estimating the SOC of a battery using an extended Kalman filter (EKF) has been proposed. However, the technique for estimating the SOC of a battery the extended Kalman filter generally uses an electric circuit model for battery modeling. However, the electric circuit model exhibits a somewhat high error rate in terms of accuracy. In addition, if the extended Kalman filter is used, when an error occurs, the errored value may be converged to an actual value by using a gain value. Thus, if the error rate is large, much time is required for the convergence.

In addition, in addition to the electric circuit model for estimating the SOC of the battery, various other battery modeling techniques are also proposed. However, in each modeling technique, if the accuracy is high, much time is consumed due to the complexity of the computation, and much load is applied to the computation device. Meanwhile, if the computation is simple, the accuracy is deteriorated.

DISCLOSURE

Technical Problem

The present disclosure is designed to solve the problems of the related art, and therefore the present disclosure is directed to providing an apparatus and method for estimating a SOC of a battery, which may ensure high accuracy with reduced computation load and time, and a battery pack including the apparatus.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for estimating a state of charge (SOC) of a battery, comprising: a measurement unit configured to measure state information of a battery; a first core unit configured to estimate a first SOC of the battery by applying a first battery modeling technique, based on the state information of the battery measured by the measurement unit; and a second core unit configured to estimate a second SOC of the battery by applying a second battery modeling technique different from the first battery modeling technique, based on the state information of the battery measured by the measurement unit, wherein the second core unit transmits the estimated second SOC to the first core unit, and wherein the first core unit estimates the first SOC of the battery by reflecting the second SOC transmitted by the second core unit.

Here, the second battery modeling technique may have a relatively longer computation time, compared to the first battery modeling technique.

In addition, the first battery modeling technique may be an electric circuit modeling technique, and the second battery modeling technique may be an electrochemical modeling technique.

In addition, the first core unit may periodically receive the second SOC and reflects the received second SOC to estimate the first SOC.

In addition, the first core unit and the second core unit may periodically estimate the first SOC and the second SOC, respectively, and the second core unit may estimate the second SOC with a longer cycle, compared to a cycle of the first SOC estimation of the first core unit.

In addition, the apparatus for estimating a SOC of a battery according to the present disclosure may further comprise an updating unit configured to periodically transmit the second SOC estimation result of the second core unit as an input value of the first core unit.

In addition, the updating unit may receive the first SOC estimation result and the second SOC estimation result from the first core unit and the second core unit, and transmit a most recently received estimation result to the first core unit.

In addition, the measurement unit may measure at least one of current, voltage and temperature of the battery, as the state information of the battery.

In another aspect of the present disclosure, there is also provided a battery pack comprising apparatus for estimating a SOC of a battery according to the present disclosure.

In another aspect of the present disclosure, there is also provided a method for estimating a SOC of a battery, comprising: measuring state information of a battery; estimating a first SOC of the battery by applying a first battery modeling technique, based on the measured state information of the battery; estimating a second SOC of the battery by applying a second battery modeling technique different from the first battery modeling technique, based on the measured state information of the battery; and estimating a first SOC of a next cycle, based on at least one of the first SOC estimated in the first SOC estimating step and the second SOC estimated in the second SOC estimating step.

Advantageous Effects

According to the present disclosure, the performance of estimating a SOC of a battery may be further improved by using a multicore.

In particular, according to an embodiment of the present disclosure, a plurality of cores may estimate SOC by means of different battery modeling techniques to complement the estimation result.

Thus, according to an embodiment of the present disclosure, the SOC of the battery may be estimated rapidly and accurately.

In addition, according to an embodiment of the present disclosure, it is possible to prevent a large burden from being applied to a computation device such as a specific core or an MCU including the core by controlling the computation cycle of at least some cores.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
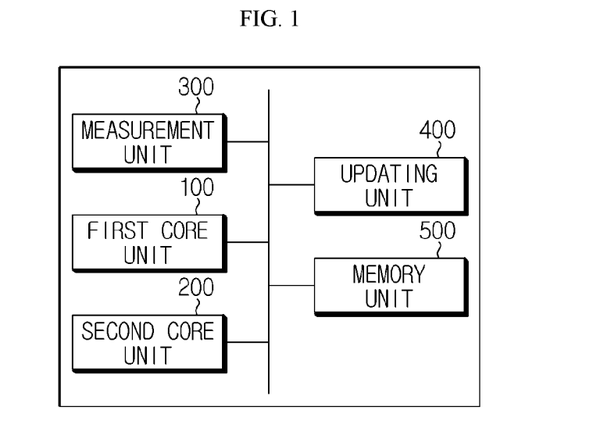
FIG. 1 is a block diagram schematically showing a functional configuration of an apparatus for estimating a SOC of a battery (hereinafter, also referred to as a 'battery SOC estimating apparatus') according to an embodiment of the present disclosure.

FIG. 1 is a block diagram schematically showing a functional configuration of an apparatus for estimating a SOC of a battery (hereinafter, also referred to as a 'battery SOC estimating apparatus') according to an embodiment of the present disclosure. Also, FIG. 2 is a diagram schematically showing operations of components employed at the battery SOC estimating apparatus according to an embodiment of the present disclosure.

Figure 2:
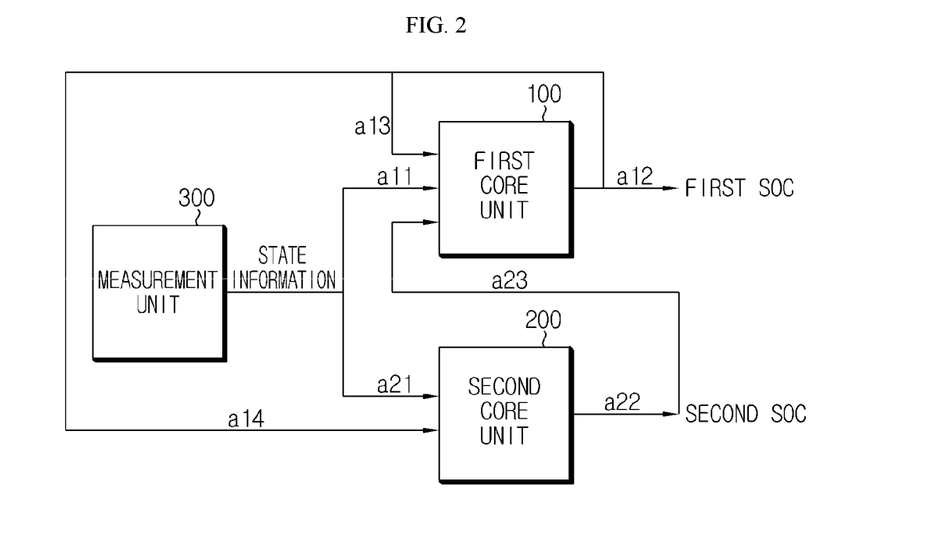
FIG. 2 is a diagram schematically showing operations of components employed at the battery SOC estimating apparatus according to an embodiment of the present disclosure.

Referring to FIGS. 1 and 2, the battery SOC estimating apparatus according to the present disclosure may include a measurement unit 300, a first core unit 100, and a second core unit 200.

The measurement unit 300 may measure state information of a battery. Here, the state information of the battery may mean various kinds of information related to a physical or chemical state of the battery. Further, the measurement unit 300 may be information that may be directly measured through a sensor or the like.

For example, the measurement unit 300 may measure a current of the battery as the state information of the battery. That is, the measurement unit 300 may measure the magnitude of a charge current or a discharge current flowing in a charging and discharging path of the battery when the battery is charged or discharged. In this case, the measurement unit 300 may measure the current of the battery using a current sensor provided at the battery.

Also, the measurement unit 300 may measure a voltage of the battery as the state information of the battery. Here, the measurement unit 300 may measure a terminal voltage of the battery or a terminal voltage of a secondary battery. In particular, the battery may include a plurality of secondary batteries. In this case, the measurement unit 300 may measure the voltage at both ends of all secondary batteries or measure the voltage at both ends of some secondary batteries.

In addition, the measurement unit 300 may measure a temperature of the battery as the state information of the battery. For example, the battery may include a temperature sensing element such as a thermistor, and the measurement unit 300 may measure the temperature of the battery by using the temperature sensing element. In particular, the measurement unit 300 may measure an external or internal temperature of the battery. For example, the measurement unit 300 may measure the temperature of the secondary battery provided inside the battery.

Preferably, the measurement unit 300 may measure at least one of the current, voltage and temperature of the battery as the state information of the battery.

If the state information of the battery is measured, the measurement unit 300 may transmit the measured state information to the first core unit 100 and the second core unit 200. That is, the state information measurement result by the measurement unit 300 may be input to input terminals of the first core unit 100 and the second core unit 200, as indicated by arrows a11 and a21 in FIG. 2. At this time, the state information transmitted to the first core unit 100 and the state information transmitted to the second core unit 200 may be identical to each other or different from each other. For example, the measurement unit 300 may transmit the current, voltage and temperature measurement results of the battery to both the first core unit 100 and the second core unit 200.

The first core unit 100 and the second core unit 200 may respectively receive the state information of the battery measured by the measurement unit 300 (a11 and a21 in FIG. 2). In particular, the first core unit 100 and the second core unit 200 may be made of different cores. Moreover, the first core unit 100 and the second core unit 200 may be different cores provided in a single integrated circuit. Accordingly, the battery SOC estimating apparatus according to the present disclosure may be regarded as a device including a multicore. For example, the battery SOC estimating apparatus according to the present disclosure may be implemented as a battery management system (BMS). At this time, the first core unit 100 and the second core unit 200 may be regarded as a multicore provided at a micro controller unit (MCU) of the BMS.

The first core unit 100 and the second core unit 200 may estimate the SOC of the battery based on the state information of the battery received from the measurement unit 300, respectively. Here, the SOC of the battery means a state of charge of the battery. That is, the first core unit 100 and the second core unit 200 may separately estimate the state of charge of the battery through individual computation processes.

At this time, the first core unit 100 and the second core unit 200 may use a battery modeling technique in estimating the SOC of the battery. In particular, the first core unit 100 and the second core unit 200 may estimate the SOC of the battery using different modeling techniques. In this specification, to distinguish the modeling techniques from each other, the battery modeling technique used by the first core unit 100 is referred to as a first battery modeling technique, and the battery modeling technique used by the second core unit 200 is referred to as a second battery modeling technique.

The first battery modeling technique and the second battery modeling technique are battery modeling methods used to estimate the state of a battery having a nonlinear characteristic and may include various modeling techniques used at the time of filing of this application. For example, the battery modeling technique may include an electric circuit model, an electrochemical model, an analytical model, and a stochastic model. Each battery modeling technique is well known at the time of filing of this application and will not be described in detail here.

In the present disclosure, the first battery modeling technique and the second battery modeling technique are different from each other. In other words, the first core unit 100 and the second core unit 200 estimate the SOC by using different battery modeling techniques.

More specifically, the first core unit 100 may estimate the SOC of the battery by applying the first battery modeling technique, based on the state information of the battery measured by the measurement unit 300 (an arrow a12 in FIG. 2). At this time, the SOC of the battery estimated by the first core unit 100 is referred to as a first SOC in this specification. In other words, the first core unit 100 may be regarded as estimating the first SOC using the first battery modeling technique.

Further, the first core unit 100 may use a recursive function in estimating the first SOC. That is, the first core unit 100 may estimate a current first SOC value by using a first estimated SOC value estimated in a previous cycle. For example, the first core unit 100 may use the first estimated SOC value by feeding back the first estimated SOC value as an input value of the first core unit 100, as indicated by an arrow a13 in FIG. 2. That is, the first core unit 100 may estimate the first SOC value of a next cycle by using the first SOC estimation result of the previous cycle.

In addition, the second core unit 200 may estimate the SOC of the battery by applying the second battery modeling technique, based on the state information of the battery measured by the measurement unit 300 (an arrow a22 in FIG. 2). At this time, the SOC of the battery estimated by the second core unit 200 is referred to as a second SOC in this specification. That is, the second core unit 200 may be regarded as estimating the second SOC using the second battery modeling technique.

Meanwhile, the second core unit 200 may use the first SOC in estimating the second SOC. That is, if the first SOC is estimated, the first core unit 100 may transmit the corresponding result to the second core unit 200, and the second core unit 200 may estimate the second SOC based on the transmitted first SOC as indicated by an arrow a14 in FIG. 2. For example, the second core unit 200 may calculate a current second estimated SOC value based on the first estimated SOC value calculated previously.

The second core unit 200 may transmit the estimated second SOC to the first core unit 100. In addition, the first core unit 100 may estimate the first SOC of the battery by reflecting the second SOC transmitted by the second core unit 200 as described above.

That is, if the second core unit 200 estimates the second SOC through the second battery modeling technique, as indicated by an arrow a23 in FIG. 2, the second core unit 200 may input the second estimated SOC value as an input parameter to an input terminal of the first core unit 100. Then, the first core unit 100 may estimate the first SOC by using the input second estimated SOC value. In addition, the estimation result of the first SOC estimated as above may be output as a current final estimated SOC value (an arrow a12 in FIG. 2). In other words, if the first SOC is estimated by reflecting the estimation result of the second SOC, the estimation result of the first SOC may be determined as the final estimated SOC value of the battery. In addition, the determined final estimated SOC value of the battery may be stored in the battery SOC estimating apparatus or may be provided to another external device such as an ECU of a vehicle. Also, the final estimated SOC value of the battery provided as above may be used to estimate the SOC of the battery again later or may be used for providing relevant information to a user or the like.

Preferably, the second battery modeling technique may have a relatively longer computation time than the first battery modeling technique. In other words, assuming that the cores have the same performance, the first battery modeling technique has a relatively short computation time compared to the second battery modeling technique. This means that the second battery modeling technique has complex computation and better accuracy, compared to the first battery modeling technique. In the battery modeling technique, if the computation is complex, a longer computation time and a more load may be applied, but higher accuracy is often ensured.

Thus, in this case, the second core unit 200 may be regarded as estimating the SOC by using a battery modeling technique with relatively high accuracy, compared to the first core unit 100. Thus, the second core unit 200 may be regarded as estimating the SOC closer to an actual value, compared to the first core unit 100.

In particular, the first core unit 100 may use an electric circuit model as the first battery modeling technique, and the second core unit 200 may use an electrochemical model as the second battery modeling technique.

Here, the electric circuit model is a technique of modeling input and output characteristics of the battery through the configuration of an electric circuit and may be realized by changing the device configuration according to the type of the battery. In particular, the electric circuit model may be implemented by modeling an equivalent circuit. The electric circuit model has advantages that the computation process is relatively simple not to require long time for the computation and the load for the computation is not greatly applied. However, the electric circuit model has somewhat low accuracy.

Meanwhile, the electrochemical model is a technique of modeling the characteristics of the battery based on chemical actions occurring inside the battery. A representative example of the electrochemical model is a Doyle-Fuller-Newman (DFN) model. The DFN model may model temporal and spatial variation of a lithium ion concentration present in a porous electrode, a potential, an intercalation kinetic, and a current density of a solid phase electrode and a solution phase electrolyte, and the like. The electrochemical model has an advantage of high accuracy.

The method for estimating the SOC of a battery using the electric circuit model and the electrochemical model is already known at the time of filing of this application and thus will not be described in detail here.

According to the embodiment of the present disclosure, the second core unit 200 may obtain an estimated SOC value (the second SOC) with high accuracy by using an electrochemical model such as the DFN model. In addition, the first core unit 100 may increase the estimation accuracy of the SOC (the first SOC) by reflecting the SOC estimation result (the second SOC) of the second core unit 200 with high accuracy to the input parameter.

Preferably, the first core unit 100 may periodically receive the second SOC. That is, the second core unit 200 may periodically transmit the estimation result of the second SOC to the first core unit 100. In addition, the first core unit 100 may estimate the first SOC by reflecting the transmitted second SOC. For example, as indicated by an arrow a23 in FIG. 2, the first core unit 100 may periodically the second SOC value from the second core unit 200, and the first core unit 100 may estimate the first SOC value by using the second SOC value whenever the second SOC value is periodically received.

For example, the first core unit 100 may recognize the second SOC value transmitted from the second core unit 200 as the actual SOC value of the battery or a value close thereto, and may correct the first SOC value based on the transmitted SOC value.

In particular, the second SOC value transmitted from the second core unit 200 may be more accurate than the first SOC value estimated by the first core unit 100. Accordingly, the first core unit 100 may periodically receive the second SOC value with high accuracy and reflect the received second SOC value in the SOC estimation. Thus, the first core unit 100 may periodically prevent an error of the first SOC estimation from increasing, thereby improving the accuracy of the SOC estimation.

Moreover, the first core unit 100 may periodically measure the first SOC. For example, the first core unit 100 may measure the first SOC once at every T1 (a first cycle). At this time, the first core unit 100 may estimate the first SOC of a current cycle based on the fed-back first SOC measured in a previous cycle.

For example, if the first core unit 100 estimates the first SOC at a cycle of 0.2 s (seconds), it may be regarded that the first SOC is estimated at the time points of t=0 s, 0.2 s, 0.4 s, 0.6 s, . . . . At this time, the first core unit 100 may use the first SOC value estimated in the immediately previous step in order to estimate the first SOC value of the current cycle (a current time point). For example, at the time point of t=0.4 s, the first core unit 100 may receive the fed-back first SOC value estimated at the time point of t=0.2 s, which is the just previous cycle, and use the first SOC value as an input value (see an arrow a13 of FIG. 2).

In addition, the second core unit 200 may periodically measure the second SOC. For example, the second core unit 200 may measure the second SOC once at every T2 (a second cycle). Here, the second core unit 200 may estimate the second SOC in a longer cycle than the first SOC estimation cycle of the first core unit 100. That is, the second cycle T2 of the second core unit 200 may be set to be longer than the first cycle T1 of the first core unit 100.

For example, if the first core unit 100 estimates the first SOC at every 0.2 s as in the embodiment, the second core unit 200 may estimate the second SOC in a longer cycle, for example at every 3 s. In this case, the second core unit 200 may transmit the second SOC estimation result to the first core unit 100 once at every 3 s. Then, the first core unit 100 estimates the first SOC by using a self-calculated previous value at every 0.2 s, and also estimates the first SOC by using the second SOC calculated by the second core unit 200 once at every 3 s. That is, the first core unit 100 estimates the SOC and provides its result value at every 0.2 s, and may correct the SOC estimation result to be closer to an actual value once at every 3 s.

According to this configuration of the present disclosure, since the cycles of the cores for estimating the SOC are differently set, the SOC may be estimated more efficiently. In particular, in terms of configuration, since a longer cycle is set for the modeling with complex computation and heavy load, it is possible to prevent the corresponding core from being overloaded. Meanwhile, a relatively short cycle is set for the core that performs a relatively simple computation, so that the SOC estimation may be updated quickly. In addition, this may lead to the improvement of accuracy of SOC estimation.

In other words, according to this configuration, the first core unit 100 may estimate the SOC rapidly with a small computational load by using a relatively simple battery modeling technique, so that somewhat low accuracy may be periodically compensated through the second core unit 200. On the contrary, the second core unit 200 uses a relatively complex battery modeling technique compared to the first core unit 100. For example, if the second core unit 200 uses an electrochemical model, a partial differential equation, an ordinary differential equation or the like should be calculated, which is mathematically complicated. Thus, a great load and a long time are applied to the computation. However, since the computation cycle for the electrochemical model is long, a large computation load may not be applied to the second core unit 200. Further, if the computation cycle of the second core unit 200 is long, excessive power consumption by the second core unit 200 may be prevented. As described above, according to the embodiment of the present disclosure, the interactions of multiple cores may compensate for the disadvantages of each core while securing advantages, thereby maximizing the efficiency of estimation of the battery SOC.

More preferably, the battery SOC estimating apparatus according to the present disclosure may further include an updating unit 400 as shown in FIG. 1.

The updating unit 400 may periodically transmit the second SOC estimation result of the second core unit 200 as an input value of the first core unit 100. For example, the updating unit 400 may input the second SOC estimation result to the first core unit 100 once at every 3 s. The operation of the updating unit 400 will be described in more detail with reference to FIG. 3.

Figure 3:
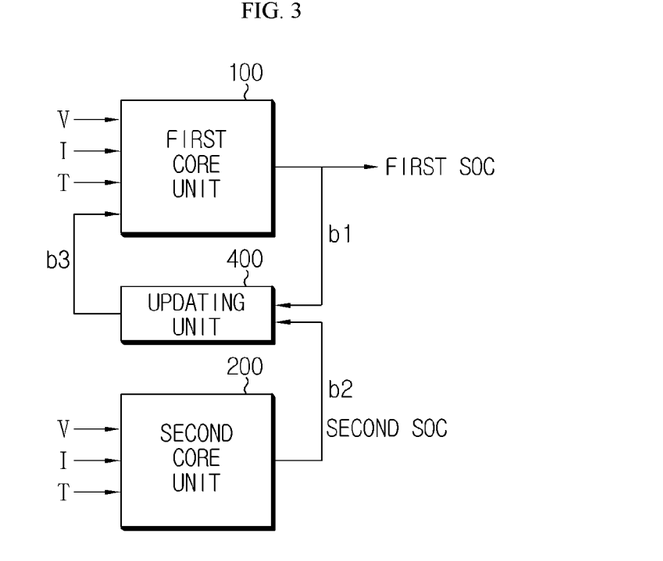
FIG. 3 is a diagram schematically showing configurations and operations of a battery SOC estimating apparatus according to another embodiment of the present disclosure.

FIG. 3 is a diagram schematically showing configurations and operations of a battery SOC estimating apparatus according to another embodiment of the present disclosure. The embodiment depicted in FIG. 3 will be described mainly based on features different from those of the former embodiment, and features identical or similar to those of the former embodiment will not be described in detail.

Referring to FIG. 3, the state information of the battery such as voltage (V), current (I) and temperature (T) may be input to the second core unit 200 to calculate the second SOC. In addition, the second SOC calculated as above may be input to the updating unit 400, as indicated by an arrow b2 in FIG. 3.

Then, the updating unit 400 may transmit the second SOC value input from the second core unit 200 as the input value of the first core unit 100, as indicated by an arrow b3 in FIG. 3. Thus, the first core unit 100 may use the second SOC value input by the updating unit 400 to estimate the first SOC in a next cycle.

In addition, the computation result of the first SOC may be transmitted to the updating unit 400. That is, if the first core unit 100 calculates the first SOC, the first core unit 100 may transmit the first SOC computation result to the updating unit 400, as indicated by an arrow b1 in FIG. 3. Then, the updating unit 400 may transmit the first SOC computation result as the input value of the first core unit 100 (b3), so that the first core unit 100 may estimate the SOC of the next cycle based on the SOC of the previous cycle.

In particular, the updating unit 400 may receive the first SOC estimation result of the first core unit 100 and the second SOC estimation result of the second core unit 200 together. In this case, the updating unit 400 may transmit a most recently received estimation result to the first core unit 100. This will be described in more detail with reference to FIG. 4.

Figure 4:
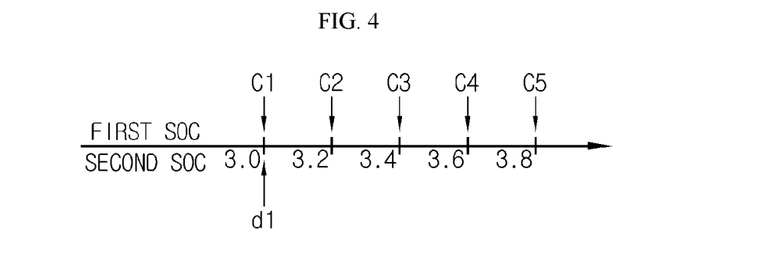
FIG. 4 is a diagram schematically showing a receiving time of a first SOC and a receiving time of a second SOC for an updating unit, employed at the battery SOC estimating apparatus according to an embodiment of the present disclosure.

FIG. 4 is a diagram schematically showing a receiving time of the first SOC and a receiving time of the second SOC for the updating unit 400, employed at the battery SOC estimating apparatus according to an embodiment of the present disclosure. In FIG. 4, the horizontal line is a time axis. Here, an arrow located above the time axis indicates the reception of the first SOC, and an arrow below the time axis indicates the reception of the second SOC. That is, c1 to c5 represent the receiving time of the first SOC for the updating unit 400, and d1 represents the receiving time of the second SOC for the updating unit 400.

Referring to FIG. 4, the reception cycle of the first SOC for the updating unit 400 is in the unit of 0.2 s, and it may be regarded that the first estimated SOC value is transmitted to the updating unit 400 at the time points of t=3.0, 3.2, 3.4, 3.6, 3.8 s, respectively (c1 to c5). In addition, in FIG. 4, it may be regarded that the second SOC is transmitted to the updating unit 400 at the time point of t=3.0 s (d1).

If the current time is after t=3.8 s, the updating unit 400 may transmit the first SOC estimation result (c5) at the time point of t=3.8 s, which is the latest reception information, to the first core unit 100 as updating information.

Meanwhile, if the most recent first SOC estimation result and the second SOC estimation result are received by the updating unit 400 at the same time, the updating unit 400 may input the second SOC estimation result to the first core unit 100 as the updating information.

For example, in the embodiment of FIG. 4, if the current time is immediately after t=3.0 s, the updating unit 400 may transmit a first SOC estimation result (c1) and a second SOC estimation result (d1) at the time point of t=3.0 s from the first core unit 100 and the second core unit 200, respectively. In this case, the updating unit 400 may transmit the second SOC estimation result (d1) to the first core unit 100 to be used for estimating the first SOC of the next cycle. For example, the updating unit 400 may transmit the second SOC estimation result (d1) at the time point of t=3.0 s to the first core unit 100, and the first core unit 100 may estimate the first SOC (c2) at the time point of t=3.2 s, based on the second SOC estimation result (d1) at the time point of t=3.0 s. That is, if the first SOC estimation result and the second SOC estimation result at the same time point are present, the updating unit 400 may prefer the second SOC estimation result to the first SOC estimation result. The second SOC estimation result may be based on a battery modeling technique with higher accuracy than the first SOC estimation result. In this case, the second SOC estimation result is closer to an actual value than the first SOC estimation result at the same time point.

Meanwhile, even though it has been illustrated in this embodiment that the updating unit 400 transmits only one of the first SOC estimation result and the second SOC estimation result to the first core unit 100, the present disclosure is not limited thereto. For example, the updating unit 400 may derive a new value by using both the first SOC estimation result and the second SOC estimation result, and input the derived value to the first core unit 100 as the updating information.

In particular, if a final receiving time of the first SOC estimation result is later than a final receiving time of the second SOC estimation result, the updating unit 400 may reflect a latest second SOC estimation result together with a latest first SOC estimation result to configure the updating information to be transmitted to the first core unit 100. That is, the updating unit 400 may derive a new SOC value (an updating SOC) by using a most recently received value of the first SOC estimation result and a most recently received value of the second SOC estimation result. In addition, the updating unit 400 transmits the derived updating SOC value to the first core unit 100, and the first core unit 100 may use the updating SOC value as a the SOC value of the previous cycle to estimate the first SOC of a next cycle.

For example, in the embodiment of FIG. 4, if the current time is a time point of t=3.3 s, it may be regarded that the last time point at which the second SOC estimation result is transmitted from the second core unit 200 to the updating unit 400 is t=3.0 s and the last time point at which the first SOC estimation result is transmitted from the first core unit 100 to the updating unit 400 is t=3.2 s. In this case, the updating unit 400 may derive a new SOC estimation result and the updating SOC by using both the first SOC estimation result (c2) at the time point of t=3.2 s and the second SOC estimation result (d1) at the time point of t=3 s. In addition, the updating unit 400 may input the derived updating SOC to the first core unit 100 as the updating information.

According to this configuration of the present disclosure, even though the first SOC is estimated most recently, since the second SOC estimation result with relatively high accuracy is reflected together, the accuracy of the SOC estimation by the first core unit 100 may be further improved.

Moreover, the updating unit 400 may endow different weights according to a time difference between the receiving time of the first SOC and the receiving time of the second SOC. For example, the updating unit 400 may be configured such that as the time difference between the receiving time of the first SOC and the receiving time of the second SOC is greater, the estimation result of the second SOC received prior to the first SOC is reflected less.

For example, in the embodiment of FIG. 4, a reflection ratio of the second SOC may be lower when the current time is t=3.5 s, compared to the case where the current time is t=3.3 s. If the current time is t=3.3 s, the time difference between the latest value receiving time (t=3.2 s) of the first SOC and the latest value receiving time (t=3.0 s) of the second SOC may be regarded as 0.2 s. In addition, if the current time is t=3.5 s, the time difference between the latest value receiving time (t=3.4 s) of the first SOC and the latest value receiving time (t=3.0 s) of the second SOC may be regarded as 0.4 s. In this case, when the updating unit 400 derives the updating SOC, the reflection ratio of the second SOC at the time point of t=3.5 may be lower than the reflection ratio of the second SOC at the time point of t=3.3 s. According to this configuration of the present disclosure, since the updating SOC is constructed by reflect the second SOC estimated latest and reliability is endowed differently depending on the estimation time of the second SOC, the SOC may be estimated more accurately.

Meanwhile, FIG. 3 depicts voltage (V), current (I) and temperature (T) as the input value of the first core unit 100 and the second core unit 200. However, this is just an example, and various input factors other than V, I and T may be input to the first core unit 100 and the second core unit 200 to estimate the SOC by using a battery modeling technique. For example, if the second core unit 200 estimates the second SOC by using an electrochemical model, in addition to V, I and T, an initial value such as a size of a unit cell, a diffusion coefficient and an initial concentration may be input to calculate a partial differential equation.

In addition, the battery SOC estimating apparatus according to the present disclosure may further include a memory unit 500 as shown in FIG. 1.

The memory unit 500 may store various information necessary for the operation of each component of the battery SOC estimating apparatus according to the present disclosure or information derived by each operation. For example, the memory unit 500 may store the first SOC estimation result obtained by the first core unit 100, the second SOC estimation result obtained by the second core unit 200, the battery state information measurement result obtained by the measurement unit 300, and the like. In addition, the memory unit 500 may store various information necessary for the first core unit 100 and/or the second core unit 200 to derive the SOC. In particular, the first core unit 100 and the second core unit 200 may calculate the SOC through different battery modeling techniques, and the memory unit 500 may store various information necessary for the first core unit 100 and the second core unit 200 to perform the battery modeling technique in order to calculate the SOC. Further, the memory unit 500 may store various specification information of the battery to which the battery SOC estimating apparatus is applied.

In addition, the memory unit 500 may transmit the stored information to each component of the battery SOC estimating apparatus according to the present disclosure, for example the first core unit 100, the second core unit 200 and the updating unit 400.

Meanwhile, it has been illustrated in the above embodiment that the electric circuit model is used as the first battery modeling technique and the electrochemical model is used as the second battery modeling technique. However, the first core unit 100 and the second core unit 200 may estimate the SOC by using various battery modeling techniques. That is, the first core unit 100 and the second core unit 200 may use different modeling technique as the first battery modeling technique and the second battery modeling technique among an electric circuit model, an electrochemical model, an analytical model and a chemical model. However, since the second core unit 200 is more complicated than the first core unit 100, the second core unit 200 may use a battery modeling technique with high accuracy even though the time required for the calculation is long. For example, the first core unit 100 may use the electric circuit model as the first battery modeling technique, and the second core unit 200 may use the stochastic model as the second battery modeling technique.

The battery SOC estimating apparatus according to the present disclosure may be included in a battery management system (BMS) that is included in a battery pack. That is, the battery management system according to the present disclosure may include the battery SOC estimating apparatus according to the present disclosure described above. In this case, a MCU of the BMS may be configured as a multicore having at least two cores, and the first core unit 100 and the second core unit 200 may be implemented by different cores of the MCU.

Also, a battery pack according to the present disclosure may include the battery SOC estimating apparatus according to the present disclosure described above. In this case, the battery SOC estimating apparatus may be included in a BMS provided in the battery pack or in a separate device. In addition, in addition to the battery SOC estimating apparatus, the battery pack according to the present disclosure may include an electric plate to which various electric components such as a relay and a fuse are mounted, a battery module in which a plurality of secondary batteries are stacked, a pack case for accommodating the battery module and the electric plate, and the like.

Also, a vehicle according to the present disclosure may include the battery SOC estimating apparatus according to the present disclosure described above. In this case, the battery SOC estimating apparatus may be included in the battery pack. Alternatively, at least a part of the battery SOC estimating apparatus may be implemented as another device at the outside of the battery pack.

Figure 5:
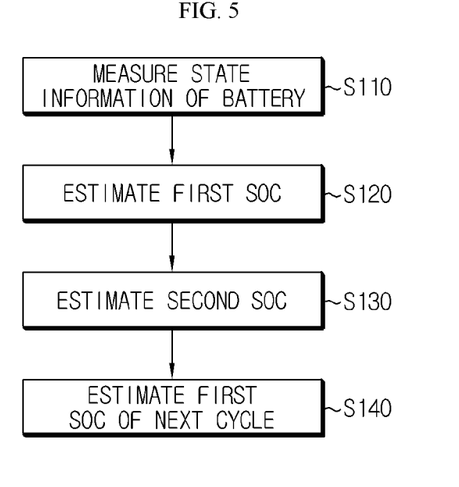
FIG. 5 is a flowchart for schematically illustrating a method for estimating a SOC of a battery according to an embodiment of the present disclosure.

FIG. 5 is a flowchart for schematically illustrating a method for estimating a SOC of a battery according to an embodiment of the present disclosure. In FIG. 5, a subject of each step may be each component of the battery SOC estimating apparatus.

As shown in FIG. 5, in the method for estimating a SOC of a battery according to the present disclosure, first, state information of the battery may be measured (S110). Here, the state information of the battery may include current, voltage, temperature and the like of the battery.

In addition, the first SOC of the battery may be estimated by applying the first battery modeling technique based on the state information of the battery measured in Step S110 (S120). Also, the second SOC of the battery may be estimated by applying the second battery modeling technique based on the state information of the battery measured in Step S110 (S130). Here, the second battery modeling technique may use a different kind of battery model than the first battery modeling technique.

In particular, the second battery modeling technique has relatively complicated computation and takes a long computation time, compared to the first battery modeling technique, but its accuracy of the SOC estimation may be relatively high. For example, in Step S120, the first SOC may be estimated using the electric circuit model, and in Step S130, the second SOC may be estimated using the electrochemical model.

Next, the first SOC of the next cycle may be estimated based on at least one of the first SOC estimated in Step S120 and the second SOC estimated in Step S130 (step S140). In particular, in Step S140, the second SOC value estimated in Step S130 may be periodically received and used to estimate the first SOC of the next cycle.

Also, Step S120 and Step S130 may be performed periodically. At this time, the second SOC estimation cycle in Step S130 may be longer than the first SOC estimation cycle in Step S120.

In addition, in Step S140, the first SOC of the next step may be estimated using a latest estimated value of the first SOC estimated in Step S120 and the second SOC estimated in Step S130, namely most recently estimated values.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Reference Signs

100: first core unit
200: second core unit
300: measurement unit
400: updating unit
500: memory unit

What is claimed is:

1. An apparatus for estimating a state of charge (SOC) of a battery, comprising:
    a measurement sensor configured to measure state information of a battery;
    a first core processor configured to estimate a first SOC of the battery by applying a first battery modeling technique, based on the state information of the battery measured by the measurement sensor; and
    a second core processor configured to estimate a second SOC of the battery by applying a second battery modeling technique different from the first battery modeling technique, based on the state information of the battery measured by the measurement sensor,
    wherein the second core processor is further configured to transmit the estimated second SOC to the first core processor,
    wherein the first core processor is further configured to estimate the first SOC of the battery by reflecting the second SOC transmitted by the second core processor,
    wherein the first battery modeling technique is an electric circuit modeling technique, and
    wherein the second battery modeling technique is an electrochemical modeling technique, the electrochemical modeling technique being modeling at least temporal and spatial variation of a lithium ion concentration present in a porous electrode, a potential, an intercalation kinetic, and a current density of a solid phase electrode and a solution phase electrolyte.

2. The apparatus for estimating an SOC of a battery according to claim 1, wherein the second battery modeling technique has a longer computation time than the first battery modeling technique.

3. The apparatus for estimating an SOC of a battery according to claim 1, wherein the first core processor is further configured to:
    periodically receive the second SOC; and
    reflect the received second SOC to estimate the first SOC.

4. The apparatus for estimating an SOC of a battery according to claim 3, wherein:
    the first core processor and the second core processor are further configured to periodically estimate the first SOC and the second SOC, respectively; and
    the second core processor is further configured to estimate the second SOC with a longer cycle, compared to a cycle of the first SOC estimation of the first core processor.

5. The apparatus for estimating an SOC of a battery according to claim 3, further comprising an updating controller configured to periodically transmit the second SOC estimation result of the second core processor as an input value of the first core processor.

6. The apparatus for estimating an SOC of a battery according to claim 5, wherein the updating controller is further configured to:
    receive the first SOC estimation result and the second SOC estimation result from the first core processor and the second core processor; and
    transmit a most recently received estimation result to the first core processor.

7. The apparatus for estimating an SOC of a battery according to claim 1, wherein the measurement sensor is further configured to measure at least one of current, voltage, and temperature of the battery, as the state information of the battery.

8. A battery pack, comprising an apparatus for estimating an SOC of a battery according to claim 1.

9. A method for estimating a state of charge (SOC) of a battery, comprising:
- measuring state information of a battery;
- estimating a first SOC of the battery by applying a first battery modeling technique, based on the state information of the battery measured;
- estimating a second SOC of the battery by applying a second battery modeling technique different from the first battery modeling technique, based on the state information of the battery measured; and
- estimating a first SOC of a next cycle, based on at least one of: the first SOC estimated in the first SOC estimating operation and the second SOC estimated in the second SOC estimating operation,
- wherein the first battery modeling technique is an electric circuit modeling technique, and
- wherein the second battery modeling technique is an electrochemical modeling technique, the electrochemical modeling technique being modeling at least temporal and spatial variation of a lithium ion concentration present in a porous electrode, a potential, an intercalation kinetic, and a current density of a solid phase electrode and a solution phase electrolyte.

* * * * *